US008860049B2

(12) United States Patent
Seo et al.

(10) Patent No.: US 8,860,049 B2
(45) Date of Patent: *Oct. 14, 2014

(54) MULTI-LIGHT EMITTING DIODE PACKAGE

(75) Inventors: Jung Hoo Seo, Ansan-si (KR); Do Hyung Kim, Ansan-si (KR); Byoung Ki Pyo, Ansan-si (KR); You Jin Kwon, Ansan-si (KR); Ju Yong Shim, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 281 days.

This patent is subject to a terminal disclaimer.

(21) Appl. No.: 13/090,862

(22) Filed: Apr. 20, 2011

(65) Prior Publication Data

US 2011/0193111 A1     Aug. 11, 2011

Related U.S. Application Data

(63) Continuation of application No. 12/164,456, filed on Jun. 30, 2008, now Pat. No. 7,960,744.

(30) Foreign Application Priority Data

Jun. 29, 2007  (KR) .................. 10-2007-0065228
Mar. 28, 2008  (KR) .................. 10-2008-0028793

(51) Int. Cl.
| H01L 33/62 | (2010.01) |
| H01L 33/58 | (2010.01) |
| H01L 25/075 | (2006.01) |
| H01L 33/50 | (2010.01) |
| H01L 33/64 | (2010.01) |

(52) U.S. Cl.
CPC ........... *H01L 25/0753* (2013.01); *H01L 33/504* (2013.01); *H01L 2224/48247* (2013.01); *H01L 2224/48091* (2013.01); *H01L 33/58* (2013.01); *H01L 33/62* (2013.01); *H01L 33/642* (2013.01); *H01L 33/647* (2013.01); *H01L 2924/12041* (2013.01); *Y10S 362/80* (2013.01)
USPC .......... 257/89; 257/E25.02; 257/13; 257/675; 257/676; 362/231; 362/800

(58) Field of Classification Search
USPC ...................... 257/79–103, E33.061
See application file for complete search history.

(56) References Cited

U.S. PATENT DOCUMENTS

| 7,138,667 B2 | 11/2006 | Barnett et al. |
| 7,303,315 B2 | 12/2007 | Ouderkirk et al. |

(Continued)

FOREIGN PATENT DOCUMENTS

| JP | 10-200166 | 7/1998 |
| JP | 11-307818 | 11/1999 |

(Continued)

OTHER PUBLICATIONS

Non-Final Office Action of U.S. Appl. No. 12/164,456 issued on Feb. 20, 2009.

(Continued)

*Primary Examiner* — Ori Nadav
*Assistant Examiner* — Ernest Allen, III
(74) *Attorney, Agent, or Firm* — H.C. Park & Associates, PLC

(57) ABSTRACT

A multi-LED package includes a heat sink including a primary slug and a secondary slug separated from each other, a primary LED chip mounted on the primary slug, one or more secondary LED chips mounted on the secondary slug, a lead frame structure electrically wired to the primary and secondary LED chips, and a phosphor covering at least a part of the primary LED chip. Another multi-LED package includes a heat sink having an upper surface and partitions protruding therefrom, a primary LED chip mounted inside the partitions, one or more secondary LED chips mounted outside the partitions, a lead frame structure electrically wired to the primary and secondary LED chips, and a phosphor covering at least a part of the primary LED chip.

15 Claims, 8 Drawing Sheets

(56) References Cited

U.S. PATENT DOCUMENTS

| | | | |
|---|---|---|---|
| 2005/0275936 A1* | 12/2005 | Gupta et al. | 359/359 |
| 2006/0133044 A1* | 6/2006 | Kim et al. | 361/704 |
| 2007/0063321 A1* | 3/2007 | Han et al. | 257/675 |
| 2007/0223219 A1* | 9/2007 | Medendorp et al. | 362/231 |

FOREIGN PATENT DOCUMENTS

| | | |
|---|---|---|
| JP | 2004-071726 | 3/2004 |
| JP | 2004-228387 | 8/2004 |
| JP | 2006-529058 | 12/2006 |
| KR | 10-0558082 | 2/2006 |
| KR | 10-2006-0099567 | 9/2006 |
| WO | 2006059828 | 6/2006 |
| WO | WO 2006059828 A1 * | 6/2006 |

OTHER PUBLICATIONS

Final Office Action of U.S. Appl. No. 12/164,456 issued on Sep. 21, 2009.

Non-Final Office Action of U.S. Appl. No. 12/164,456 issued on Jun. 25, 2010.

Notice of Allowance of U.S. Appl. No. 12/164,456 issued on Apr. 4, 2011.

* cited by examiner (a)

(b)

(c)

(a)

(b)

(c)

MULTI-LIGHT EMITTING DIODE PACKAGE

CROSS REFERENCE TO RELATED APPLICATIONS

This application is a continuation of U.S. patent application Ser. No. 12/164,456, filed on Jun. 30, 2008, and claims priority from and the benefit of Korean Patent Application No. 10-2007-0065228, filed on Jun. 29, 2007, and Korean Patent Application No. 10-2008-0028793, filed on Mar. 28, 2008, which are hereby incorporated by reference for all purposes as if fully set forth herein.

BACKGROUND OF THE INVENTION

1. Field of the Invention

The present invention relates to a multi-light emitting diode (multi-LED) package, and more particularly to a multi-LED package to simultaneously or individually emit different colors of light including white, infrared or ultraviolet.

2. Description of the Related Art

Generally, an LED package includes an LED chip, a lead frame through which electric current is applied to the LED chip, and a housing for supporting the lead frame. In recent years, attention to LED package-based lightings has rapidly increased. To apply the LED package to lightings, improved luminescence and a high optical output of 1,000's of lumens or more are sought. Since output luminescence is proportional to the amount of input current, a desired optical output can be obtained by supplying a high electric current to the LED chip. However, this increase in input current may generate excessive heat.

Further, if the heat is not dissipated from the LED package, the heat may cause dislocations and mismatches in a semi-conductor crystal of the LED chip, thereby reducing a service life of the LED chip. Hence, a heat sink is provided to the LED package as a heat absorption or dissipation source.

The LED package may include a plurality of LED chips mounted on a heat sink formed of a single heat dissipation slug to emit light of different wavelengths such that the LED chips can be individually operated to emit multiple colors. In general, a red LED chip, a green LED chip, and a blue LED chip are mounted together in a single LED package to emit plural colors by operating the LED chips in an individual manner or in combination. One example of this technique is disclosed in Korean Patent No. 0558082 issued to this application's Assignee.

However, if the LED chips for emitting red, green and blue colors are mounted together in the single LED package, all of the LED chips are operated to emit white light. Accordingly, it is difficult for the LED package to adjust the balance between colors.

Additionally, since an LED chip for emitting white light includes a phosphor, there are many difficulties in mounting the white LED chip and other LED chips for emitting different colors in a single LED package.

Furthermore, to achieve individual operation of the LED chips on a single heat dissipation slug made of a conductive metal, the LED chips have been lateral-type LED chips that are electrically insulated from the heat dissipation slug, and each LED chip is electrically wired by a two-bonding method in which the LED chip is connected to two lead-frames via two bonding wires. Therefore, for a vertical-type LED chip having an electrode disposed on the bottom of the LED chip and electrically connected to the heat dissipation slug, application thereof to such an LED package as described above is difficult.

SUMMARY OF THE INVENTION

The present invention provides a multi-LED package that includes a white LED chip and other color LED chips in a single package to emit a variety of colors while providing improved heat dissipation.

The present invention also provides a multi-LED package to individually emit white light and other color light while providing improved heat dissipation.

Additional features of the invention will be set forth in the description which follows, and in part will be apparent from the description, or may be learned by practice of the invention.

The present invention discloses a multi-LED package including: a heat sink including a primary slug and a secondary slug separated from each other; a primary LED chip mounted on the primary slug; a secondary LED chip mounted on the secondary slug; a lead frame structure electrically wired to the primary and secondary LED chips to individually operate the primary and secondary LED chips; and a phosphor on above the primary slug to cover at least a part of the primary LED chip.

The multi-package may further include a housing to support the lead frame structure and the heat sink. Here, the housing has an opening formed at an upper portion thereof through which light generated from the primary and secondary LED chips is emitted to an outside.

Light obtained by a combination of the primary LED chip and the phosphor may be white light.

The primary slug may include a cavity depressed on an upper surface thereof to accommodate the primary LED chip. Here, the cavity is filled with the phosphor that covers the primary LED chip.

The primary LED chip is attached to a bottom surface of the cavity. Here, the bottom surface of the cavity is coplanar with an upper surface of the secondary slug to which the secondary LED chip is attached.

Alternatively, the primary slug may include a partition protruding from the upper surface thereof to define a partitioned space inside the partition, and the partitioned space may accommodate the primary LED chip therein and be filled with the phosphor covering the primary LED chip.

Alternatively, the primary slug may include a partition or a cavity formed thereon to accommodate the primary LED chip and the phosphor inside the partition or the cavity, and the secondary slug may include a partition or a cavity formed thereon to accommodate the secondary LED chip inside the partition or the cavity.

The heat sink may include a single primary slug and a plurality of the secondary slugs. Here, the single primary slug and the plural secondary slugs are disposed outside a center of the opening, and the primary LED chip and the secondary LED chip are disposed along the same circumference around the center of the opening on the single primary slug and the secondary slugs, respectively.

Each of the primary and secondary LED chips may be one selected from a vertical-type LED chip electrically connected to the heat sink in a direct manner and a lateral type LED chip electrically connected to the lead frame structure via two bonding wires while being electrically insulated from the heat sink.

The lead frame structure may include a plurality of lead frames. The number of lead frames is twice or more the total number of slugs including the primary and secondary slugs.

The present invention also discloses a multi-LED package including: a heat sink including an upper surface and partitions protruding from the upper surface; a primary LED chip mounted inside the partitions on the heat sink; a secondary LED chip mounted outside the partitions on the heat sink; a lead frame structure electrically wired to the primary and secondary LED chips to individually operate the primary and secondary LED chips; and a phosphor disposed on the heat sink to cover at least a part of the primary LED chip.

Light obtained by a combination of the primary LED chip and the phosphor may be white light. The at least one secondary LED chip may be one or more LED chips selected from a red LED chip, a green LED chip, a blue LED chip, an infrared LED chip, and an ultraviolet LED chip.

The primary and secondary LED chips may be disposed along the same circumference around a center of the opening.

The partitions may be integrally formed with the heat sink.

The heat sink may further include other partitions formed on the upper surface thereof to surround the at least one secondary LED chip.

It is to be understood that both the foregoing general description and the following detailed description are exemplary and explanatory and are intended to provide further explanation of the invention as claimed.

BRIEF DESCRIPTION OF THE DRAWINGS

The above and other objects, features and advantages of the present invention will become apparent from the following description of exemplary embodiments given in conjunction with the accompanying drawings, in which.

DETAILED DESCRIPTION OF THE ILLUSTRATED EMBODIMENTS

Exemplary embodiments of the present invention will be described in detail with reference to the accompanying drawings hereinafter. The embodiments are given by way of illustration for full understanding of the present invention by those skilled in the art. Hence, the present invention is not limited to these embodiments and can be realized in various forms.

Figure 1:
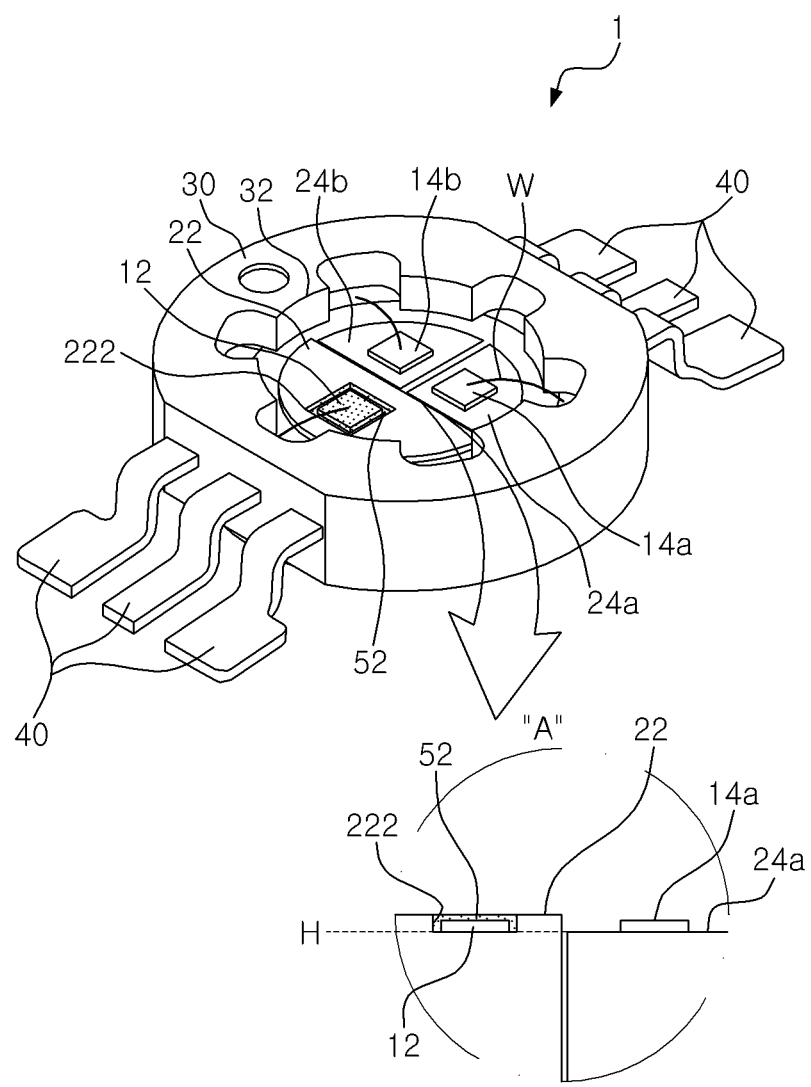
FIG. 1 is a perspective view of a multi-LED package according to one embodiment of the present invention.
Figure 2:
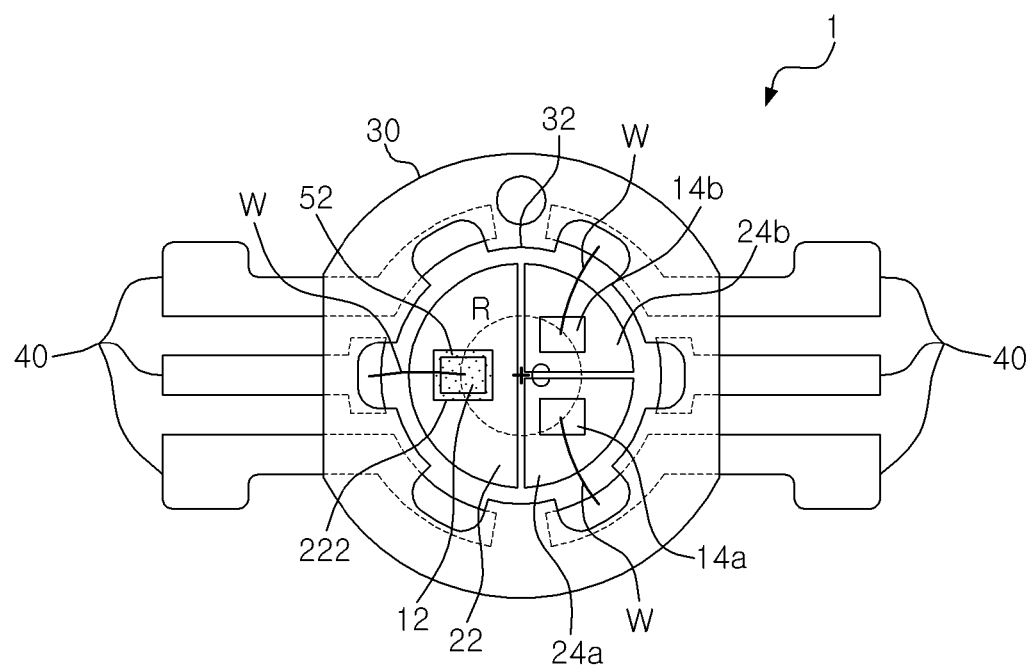
FIG. 2 is a plan view of the multi-LED package shown in FIG. 1.

FIG. 1 is a perspective view of a multi-LED package according to one embodiment of the present invention, and FIG. 2 is a plan view of the multi-LED package shown in FIG. 1.

Referring to FIGS. 1 and 2, the multi-LED package 1 of this embodiment includes a plurality of LED chips 12, 14a and 14b, a plurality of lead frames 40 through which electric current is applied to the plurality of LED chips 12, 14a and 14b, and a plurality of slugs 22, 24a and 24b acting as a heat sink for heat dissipation and providing areas for mounting the plural LED chips 12, 14a and 14b. The plural slugs 22, 24a and 24b serve as heat dissipation elements and power application elements for applying electric current to the plural LED chips 12, 14a and 14b together with the lead frames 40.

The multi-LED package 1 includes a housing 30 that supports the lead frames 40 and the plural slugs 22, 24a and 24b. The housing 30 has an opening 32 formed at an upper portion thereof to surround the LED chips 12, 14a and 14b. Although not shown in the drawings, the opening 32 may be provided with an encapsulation member (not shown) made of a transparent material to protect the LED chips 12, 14a and 14b from the external environment.

In this embodiment, the plural LED chips 12, 14a and 14b include a single primary LED chip 12 for realizing white light, and two secondary LED chips 14a and 14b for emitting different colors. The primary LED chip 12 is provided with a phosphor which transforms light of a predetermined wavelength range emitted from the primary LED chip 12 to light of a different wavelength. As a result, white light can be realized by the combination of the light transformed by the phosphor and non-transformed light. In this embodiment, white light is obtained by the combination of the primary LED chip 12 emitting blue light and a yellow phosphor 52. However, the present invention is not limited thereto. To realize white light, a variety of combinations between a variety of LED chips and a variety of phosphors can be considered.

Herein, among the plural slugs 22, 24a and 24b, the slug 22 having both the primary LED chip 12 and the phosphor 52 is referred to as a "primary slug," and the slugs 24a and 24b having the secondary LED chips 14a and 14b are referred to as "secondary slugs." The primary slug 22 and the secondary slugs 24a and 24b may be formed by dividing a single semi-cylindrical metallic material such that the slugs are spaced from one another. Here, division and separation of the single semi-cylindrical metallic material are performed such that a single semi-circular primary slug 22 and two fan-shaped secondary slugs 24a, 24b can be arranged outside the center C (see FIG. 2) of the opening 32 of the housing 30.

As clearly shown in FIG. 2, the primary LED chip 12 and the secondary LED chips 14a and 14b are disposed on the primary slug 22 and the secondary slugs 24a and 24b, respectively, along the same imaginary circumference R spaced a predetermined radius from the center C of the opening 32. Hence, all of the primary and secondary LED chips 12, 14a and 14b can be disposed inside the opening 32 without being biased to one side, which helps light emitted from the LED chips 12, 14a and 14b to be more uniformly emitted to the outside, for example, through a semi-spherical encapsulation member, if mounted on the opening 32. Furthermore, the distances between the LED chips 12, 14a and 14b may be decreased by setting a radius from the center C to the circumference R to be as small as possible.

The primary slug 22 has a cavity 222 formed on an upper surface thereof to accommodate the primary LED chip 12. The primary LED chip 12 is attached to the bottom of the cavity 222 which is filled with the phosphor 52 to cover the primary LED chip 12. In this embodiment, the phosphor 52 is mixed with a transparent resin, such as silicone, epoxy, etc., and fills the cavity 222. When the transparent resin is cured to a solid state, the phosphor 52 mixed with the transparent resin is secured inside the cavity 222 and serves to convert light emitted from the primary LED chip 12 into white light. At this time, instead of filling the cavity 222 with the phosphor 52 and resin, the phosphor may be coated around the primary LED chip 12 by, for example, electrophoresis.

The two secondary LED chips 14a and 14b are attached to upper surfaces of the secondary slugs 24a and 24b. The secondary LED chips 14a and 14b may be light emitting diodes that emit blue light, red light, green light, UV light, IR light, other colors, or light of different wavelengths. Herein, the secondary LED chips 14a and 14b are used to realize colors other than white light. In this embodiment, two secondary LED chips 14a and 14b, and two secondary slugs 24a, 24b having the secondary LED chips 14a and 14b are used. However, the present invention is not limited thereto. For reference, if the LED package has all of the secondary LED chips for emitting blue, red, and green colors with the primary LED chip and phosphor provided to the LED package for realizing the white light, the LED package can be used as an LED package that can selectively employ one of white, blue, red and green colors.

As shown in Circle "A" of FIG. 1, the bottom surface of the cavity 222 of the primary slug 22 is coplanar with the upper surface of the secondary slug 24a at the same height H. This means that, even if the primary LED 12 is mounted on the bottom surface of the cavity 222 depressed below an upper surface of the primary slug 22, the mounting height of the primary LED chip 12 is substantially the same as those of other LED chips. This configuration can prevent differences in luminescence characteristics of the LED chips due to a height difference between the LED chips.

Referring again to FIGS. 1 and 2, particularly, to FIG. 2, all of the primary and secondary LED chips 12, 14a and 14b are vertical type LED chips, which can be electrically connected to the primary and secondary slugs 22, 24a and 24b on the bottom surfaces thereof, respectively. Accordingly, each of the primary and secondary LED chips 12, 14a and 14b is electrically wired by a single bonding method in which each LED chip is electrically connected to a corresponding lead frame via a single bonding wire W.

In this embodiment, the LED package 1 employs the vertical type LED chips, each of which is electrically connected to the slug 22, 24a or 24b and to the lead frame 40, as described above. However, the present invention is not limited thereto. According to the exemplary embodiments of the present invention, the LED package permits installation of lateral type LED chips, each of which is electrically insulated from the slug 22, 24a or 24b and has two upper electrodes electrically connected to two lead frames 40 via two bonding wires.

Figure 3:
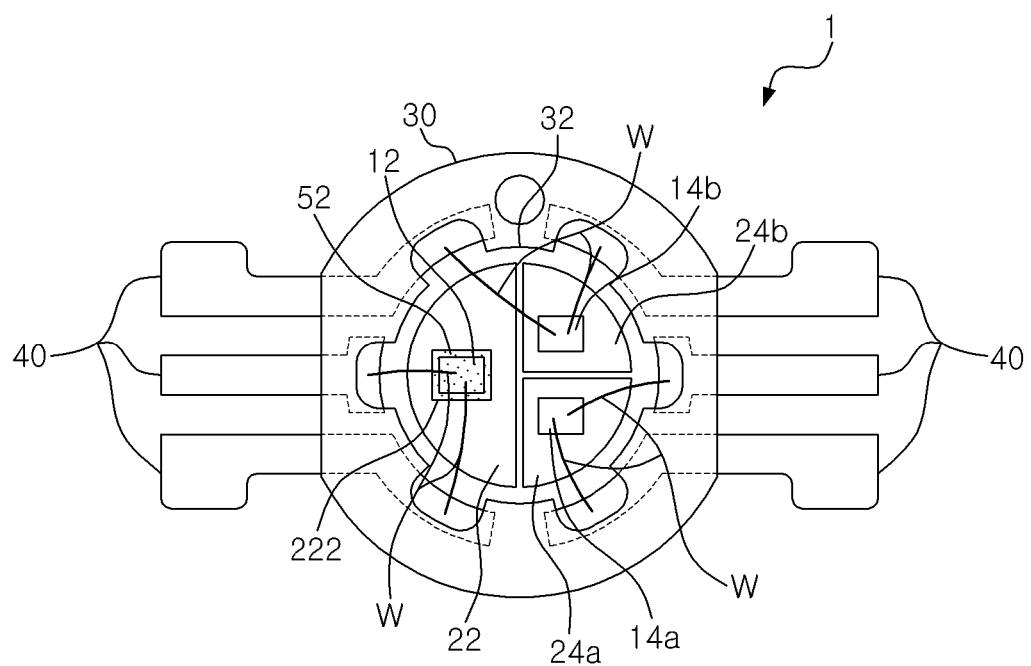
FIG. 3 is a plan view of a multi-LED package according to another embodiment of the present invention.

Another embodiment of the present invention will be described with reference to FIG. 3 showing a different configuration from the above embodiment shown in FIG. 2. In the embodiment shown in FIG. 3, primary and secondary LED chips 12, 14a and 14b are all lateral type LED chips and each is electrically wired to two lead frames 40 via two bonding wires W by a double-bonding method. At this time, all of the LED chips 12, 14a and 14b are electrically insulated from the slugs 22, 24a and 24b. In this case, the slugs 22, 24a and 24b serve only as heat dissipation elements.

As such, to permit both vertical type LED chips and lateral type LED chips to be used as the LED chips mounted on the plural slugs 22, 24a and 24b, the number of lead frames 40 is twice or more the total number of slugs 22, 24a and 24b. If the number of lead frames 40 is twice the number of slugs 22, 24a and 24b, the respective lateral type LED chips 12, 14a and 14b mounted on the slugs 22, 24a and 24b are connected to all of the frames 40 by the double bonding method. In this embodiment, both the total number of LED chips 12, 14a and 14b and the total number of slugs 22, 24a and 24b are 3, and the total number of lead frames 40 is twice the total number of slugs, or 6.

Additionally, although not shown in the drawings, the LED package may include a Zener diode to electrically protect at least one LED chip among the plural LED chips including the primary LED chip 12 and the secondary LED chips 14a and 14b. The Zener diode is a semiconductor device that permits electric current to rapidly increase by application of a relatively high voltage to a p-n junction in the reverse direction and permits the voltage to be maintained. Configuration and installation position of the Zener diode are disclosed in Korean Patent No. 0558082 issued to the applicant of this application.

Figure 4:
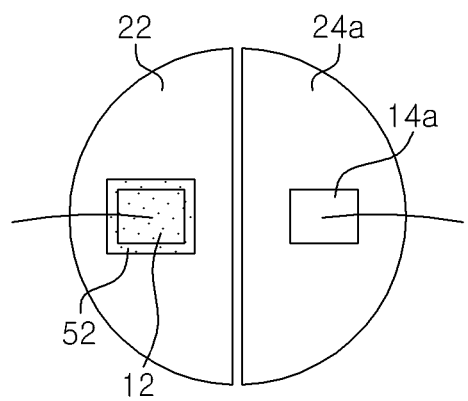
FIGS. 4 (a) to (c) are plan views of slugs according to other embodiments of the present invention.
Figure 4:
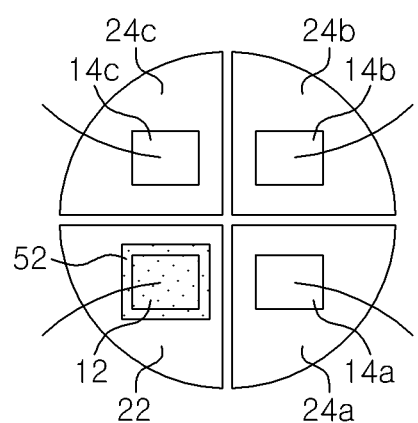
Figure 4:
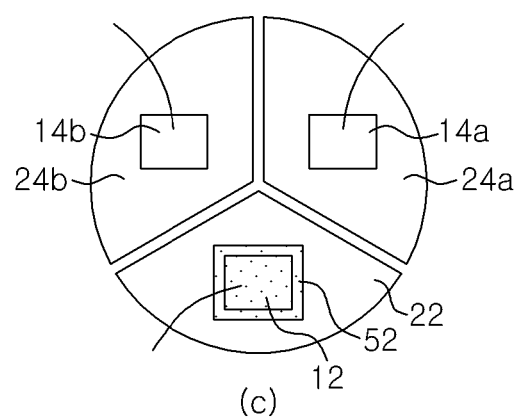

Meanwhile, the present invention is not limited to the aforementioned number and shape of the slugs. FIGS. 4 (a) to (c) show slugs according to other embodiments of the present invention.

In an embodiment shown in FIG. 4 (a), a single primary LED chip 12 and a phosphor 52 are disposed on a single primary slug 22, and a single secondary LED chip 14a is disposed on a single secondary slug 24a. Here, the primary slug 22 and the secondary slug 24a have semicircular shapes and face each other on linear portions of the semicircular shapes. In an embodiment shown in FIG. 4 (b), with four slugs 22, 24a, 24b, and 24c separated from one another, a single primary LED chip 12 and a phosphor 52 are disposed on a single primary slug 22, and secondary LED chips 14a, 14b and 14c are disposed on three secondary slugs 24a, 24b and 24c, respectively. An embodiment shown in FIG. 4 (c) includes three slugs 22, 24a and 24b arranged in the shape of a trisected circle. For reference, the slugs of the embodiment shown in FIGS. 1 to 3 include three divided slugs 22, 24a and 24b, wherein the primary slug 22 has a semicircular shape and a greater area than either of the secondary slugs 24a and 24b.

Figure 5:
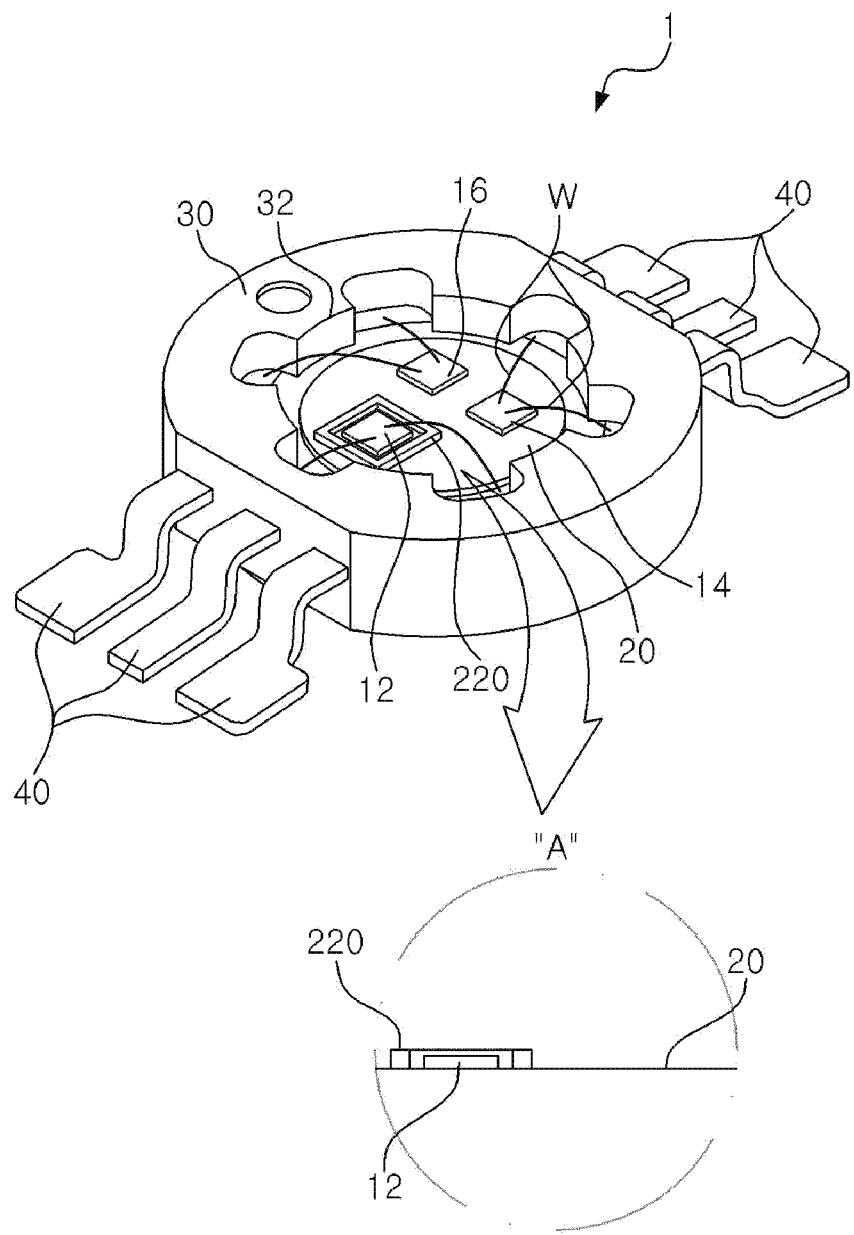
FIG. 5 is a perspective view of a multi-LED package according to yet another embodiment of the present invention.
Figure 6:
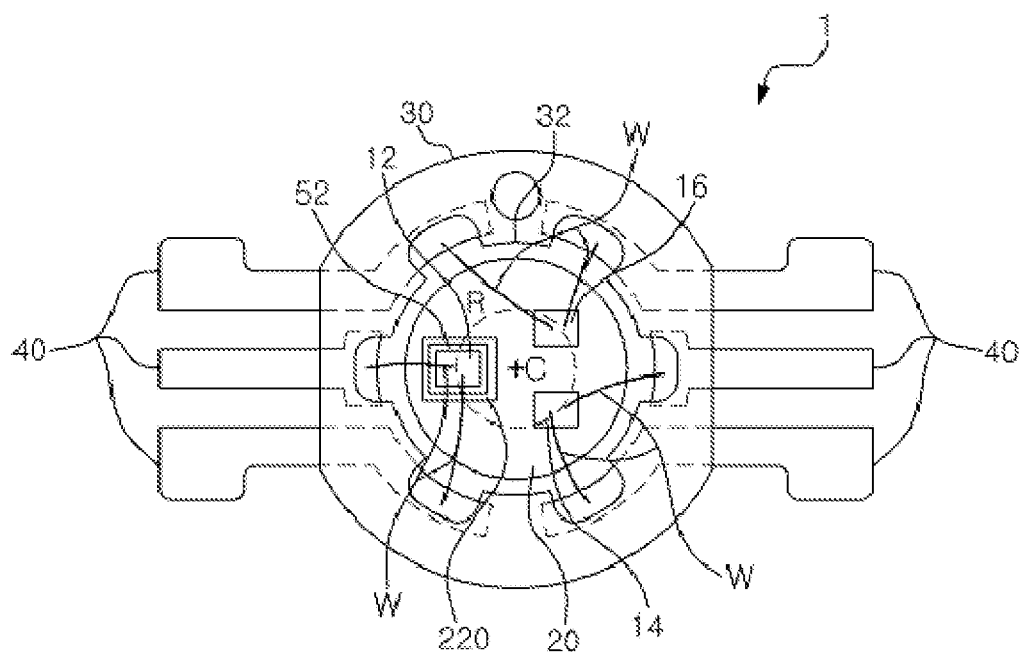
FIG. 6 is a plan view of the multi-LED package shown in FIG. 5.

FIG. 5 is a perspective view of a multi-LED package according to yet another embodiment of the present invention and FIG. 6 is a plan view of the multi-LED package shown in FIG. 5.

Referring to FIGS. 5 and 6, the multi-LED package 1 of this embodiment includes a primary LED chip 12, secondary LED chips 14 and 16 for emitting different colors from that of the primary LED chip 12, a heat sink 20 mounting the primary and secondary LED chips 12, 14 and 16 while acting as a heat dissipation member, lead frames 40 electrically wired to operate the primary and secondary LED chips 12, 14 and 16, a housing 30 supporting the heat sink 20 and the lead frames 40, and partitions 220 formed on the heat sink 20 to define a space for accommodating the primary LED chip 12.

The primary LED chip 12 is an LED chip for realizing white light. The secondary LED chips 14 and 16 may be selected from a red LED chip, a green LED chip, a blue LED chip, an IR LED chip, and a UV LED chip. For the primary LED chip 12, a phosphor is coated around the primary LED chip for realizing white light. Thus, if the primary LED chip 12 is mounted together with the secondary LED chips 14 and 16 in a single package, a separate space may be provided for coating the phosphor on the primary LED chip 12.

Accordingly, the partitions 220 may provide the space for accommodating the primary LED chip 12 and protrude from an upper surface of the heat sink 20, as shown in circle "A" of FIG. 5. The partitions 220 may be made of the same material as the heat sink 20. The partitions 220 may be integrally formed with the heat sink 20. With this configuration, the multi-LED package 1 can more effectively dissipate heat that results from operation of the primary LED chip 12. Further, the phosphor (not shown) is also provided inside the partitions 220 to cover the primary LED chip 12 accommodated inside the partitions 220.

The space defined by the partitions 220 is open at an upper side and surrounds the primary LED chip 12. Specifically, since the primary LED chip 12 generally has four lateral sides, the partitions 220 may include four contiguous protrusions, each protrusion corresponding to one of the four lateral sides of the primary LED chip 12. However, the present invention is not limited to this configuration. In other words, the partitions 220 may have any arrangement so long as a space is defined to accommodate the primary LED chip and the phosphor therein.

In operation of the primary LED chip 12, a portion of light having a predetermined wavelength emitted from the primary LED chip 12 is transformed into light of a different wavelength by the phosphor, and is then mixed with non-transformed light, realizing white light.

Further, the multi-LED package 1 includes a housing 30 that supports the lead frames 40 and the heat sink 20. The housing 30 is formed at an upper portion thereof with an opening 32 that surrounds the LED chips 12, 14 and 16, that is, an internal space of a cavity. As described in the above embodiment, the opening 32 may be molded with a transparent encapsulation material, which protects the LED chips 12, 14 and 16 from the external environment.

With this configuration, plural LED chips including an LED chip for realizing white light in a single package can be mounted in the multi-LED package 1 according to this embodiment, thereby solving the problem of the conventional LED package designed to realize various colors.

In FIG. 6, the LED chips 12, 14 and 16 are equidistant from the center C of the heat sink 20. That is, the LED chips 12, 14 and 16 are disposed on an imaginary circumference R spaced a predetermined radius from the center C of the heat sink 20. With this configuration, for example, if a semi-spherical encapsulation member (not shown) is mounted on the opening 32, light emitted from the LED chips 12, 14 and 16 can be more uniformly emitted to the outside through the encapsulation member. As a result, design and application of secondary optics can be easily accomplished.

In FIGS. 5 and 6, the respective LED chips 12, 14 and 16 are lateral type LED chips, each of which is electrically connected to the lead frames 40 by two bonding wires W. Thus, the heat sink 20 of this embodiment may be formed into an integral body, which is different from the above embodiments wherein the slugs 22, 24a, 24b, and 24c acting as the heat sink are separated from one another corresponding to the LED chips.

In the embodiment shown in FIGS. 5 and 6, two secondary LED chips 14 and 16 are shown. However, the secondary LED chips 14 and 16 simultaneously operated to emit red, green and blue colors can all be mounted on the heat sink 20 to emit various colors. In other words, the secondary LED chips 14 and 16 may be selected from a red LED chip, a green LED chip, a blue LED chip, an IR LED chip, and a UV LED chip.

Figure 7:
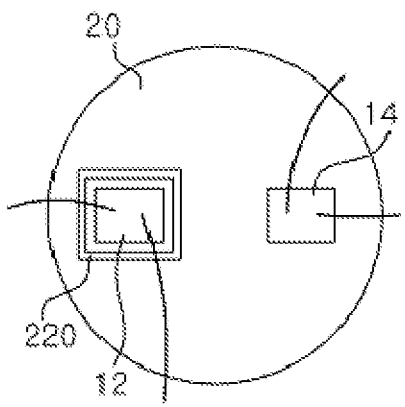
FIGS. 7 (a) to (c) are schematic plan views of various modifications of the multi-LED package shown in FIG. 5.
Figure 7:
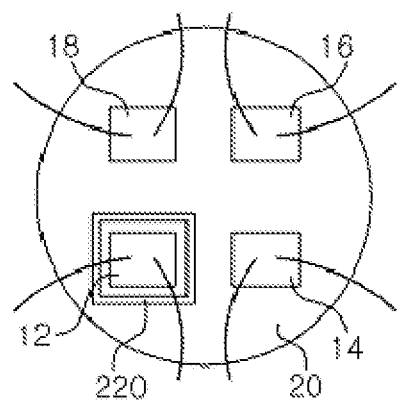
Figure 7:
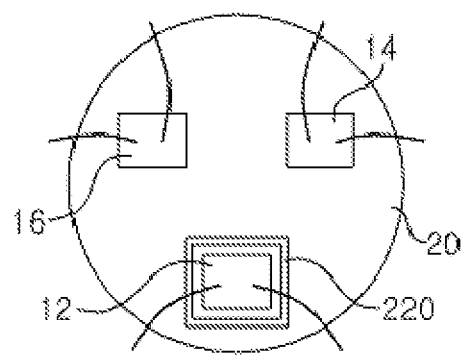

FIGS. 7 (a) to (c) are schematic plan views of various modifications of the multi-LED package 1 shown in FIG. 5. FIG. 7(a) is a schematic view of a multi-LED package that includes the primary LED chip 12 used for realizing white light, partitions 220 disposed to surround the primary LED chip 12, a single secondary LED chip 14 selected from the red LED chip, green LED chip, blue LED chip, IR LED chip and UV LED chip, and a heat sink 20 on which the primary LED chip 12, secondary LED chip 14, and partitions 220 are mounted.

FIG. 7(b) is a schematic view of a multi-LED package that includes a primary LED chip 12 accommodated inside partitions 220 to realize white light, three secondary LED chips 14, 16 and 18 selected from the red LED chip, green LED chip, blue LED chip, IR LED chip and UV LED chip, and a heat sink 20 on which the primary LED chip 12, secondary LED chips 14, 16 and 18, and partitions 220 are mounted. For example, reference numeral 14 may indicate the red LED chip, reference numeral 16 may indicate the green LED chip, and reference numeral 18 may indicate the blue LED chip.

FIG. 7(c) is a schematic view of a multi-LED package that includes a primary LED chip 12 accommodated inside partitions 220 to realize white light, two secondary LED chips 14 and 16 selected from the red LED chip, green LED chip, blue LED chip, IR LED chip and UV LED chip, and a heat sink 20 on which the primary LED chip 12, secondary LED chips 14 and 16, and partitions 220 are mounted.

The multi-LED packages shown in FIGS. 7 (a) to (c) may also have the phosphor inside the partitions 220 along with the LED chip 12 for realizing white light. The multi-LED package may include more secondary LED chips than the multi-LED packages shown in FIGS. 7 (a) to (c). These modifications are within the spirit and scope of the present invention, but to avoid cumulative description, they will not be separately described.

In the embodiments shown in FIGS. 5 to 7, the LED chips 12, 14, 16, and 18 are illustrated as lateral type LED chips that are electrically wired to the lead frames 40 via two bonding wires W by the double bonding method when mounting a single primary LED chip 12 and other secondary LED chips 14, 16, and 18 together in a single package. However, the present invention is not limited thereto. That is, the use of the partitions 220 disposed on the heat sink 20 to accommodate the primary LED chip 12 for realizing white light can be applied to other types of LED chips as well as the lateral type LED chip.

Figure 8:
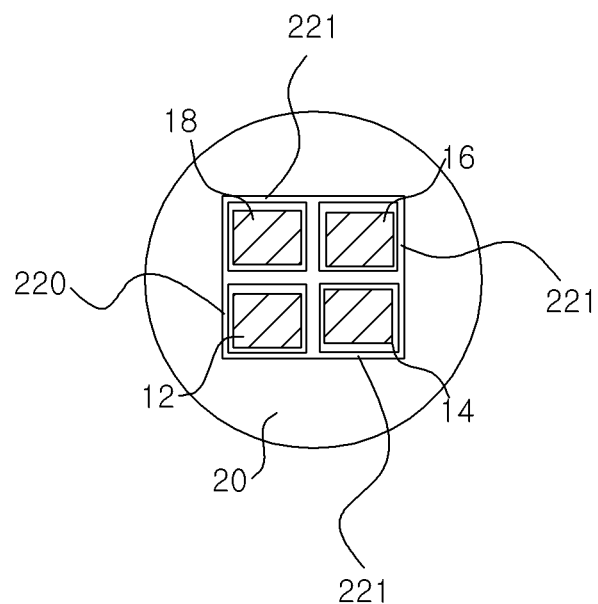
FIG. 8 is a plan view of a multi-LED package according to yet another embodiment of the present invention.

FIG. 8 shows a multi-LED package according to yet another embodiment of the present invention. In FIG. 8, a heat sink 20 further includes additional partitions 221 for individually surrounding secondary LED chips 14, 16, and 18 in addition to the partitions 220 surrounding the primary LED chip 12. The partitions 220 and 221 are connected to one another to provide a lattice arrangement. The partitions 220 and 221 protrude from the upper surface of the heat sink 20.

Figure 9:
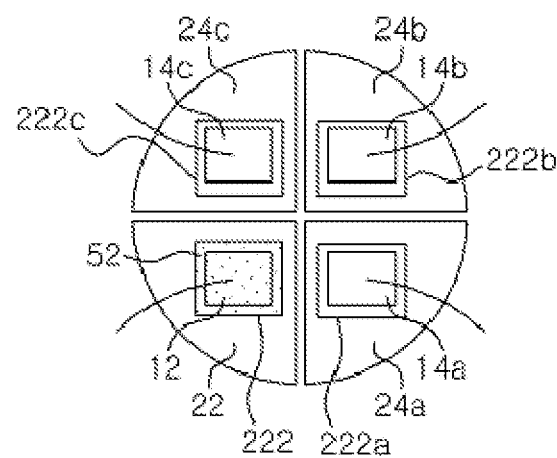
FIG. 9 is a plan view of a multi-LED package according to yet another embodiment of the present invention.

FIG. 9 shows a modification of the multi-LED packages shown in FIGS. 1 to 4. In FIG. 9, the primary slug 22 is formed with a cavity 222 for accommodating the primary LED chip 12 and the phosphor 52, and secondary slugs 24a, 24b, and 24c are formed with other cavities 222a, 222b, and 222c for accommodating the secondary LED chips 14a, 14b, and 14c, respectively. Alternatively, the primary and secondary slugs 22, 24a, 24b, and 24c may be formed with partitions 220 and 221 instead of the cavities.

The cavities or partitions for accommodating the secondary LED chips may reduce or suppress interference of light from the LED chips while the primary and/or secondary LED chips are simultaneously operated. The cavities or partitions for accommodating the secondary LED chips may also include a phosphor on the secondary LED chips for a particular application.

As apparent from the above description, according to one embodiment of the present invention, the multi-LED package includes a white LED chip and other color LED chips in a single package to realize white light and various colors. Furthermore, according to one embodiment, the multi-LED package may include an IR LED chip and a UV LED chip in a single package along with the white LED chip, thereby providing a variety of functions to users.

According to one embodiment of the present invention, the multi-LED package permits individual operation of plural LED chips for realizing white light and various colors.

According to one embodiment of the present invention, the multi-LED package permits effective dissipation of heat from the LED chips to the outside, thereby preventing service life and performance of the LED chips from deteriorating due to the heat.

According to one embodiment of the present invention, the multi-LED package permits the use of vertical-type LED chips electrically connected to the slugs or lateral-type LED chips electrically insulated from the slugs, and exhibits excellent availability.

Although the present invention has been described with reference to the embodiments and the accompanying drawings, the invention is not limited to the embodiments and the drawings. It should be understood that various modifications and changes can be made by those skilled in the art without departing from the spirit and scope of the present invention as defined by the accompanying claims.

What is claimed is:

1. A multi-light emitting diode (LED) package, comprising:
   an integrally formed heat sink comprising an upper surface and a cavity on the upper surface;
   a primary LED chip arranged on a bottom surface of the cavity;
   a secondary LED chip arranged on the heat sink upper surface outside the cavity, the secondary LED chip being one of a red LED chip, a green LED chip, a blue LED chip, an infrared LED chip, and an ultraviolet LED chip;
   a lead frame structure electrically connected to the primary LED chip and the secondary LED chip, the lead frame structure to individually operate the primary LED chip and the secondary LED chip; and
   a phosphor mixed with a transparent resin, the phosphor and the transparent resin being arranged in the cavity to cover at least a part of the primary LED chip;
   wherein the secondary LED chip is not covered by any phosphor,
   wherein the multi-LED package is configured to emit a white light using the phosphor and the primary LED chip, a non-white light using the secondary LED chip, or both the white light and the non-white light,
   wherein the primary LED chip is arranged on the bottom surface of the cavity, the bottom surface of the cavity being coplanar with an upper surface of the heat sink, and wherein the bottom surface of the cavity is separated from the upper surface of the heat sink by a raised partition protruding from the heat sink,
   wherein the raised partition comprises a coplanar upper surface that completely surrounds the primary LED chip and separates the primary LED chip from the secondary LED chip.

2. The multi-LED package of claim 1, further comprising:
   a housing to support the lead frame structure and the heat sink, the housing comprising an opening in an upper portion thereof, through which the white light or the non-white light is selectively emitted.

3. The multi-LED package of claim 1, wherein the cavity is surrounded by the partition.

4. A multi-light emitting diode (LED) package, comprising:
   a heat sink comprising a primary slug and a secondary slug;
   a primary LED chip arranged in a cavity on the primary slug, an upper surface of the primary slug surrounding the cavity and the primary LED chip;
   a secondary LED chip arranged on the secondary slug, the secondary LED chip being one of a red LED chip, a green LED chip, a blue LED chip, an infrared LED chip, and an ultraviolet LED chip;
   a lead frame structure electrically connected to the primary LED chip and the secondary LED chip, the lead frame structure to individually operate the primary LED chip and the secondary LED chip; and
   a phosphor mixed with a transparent resin, the phosphor and the transparent resin being arranged in the cavity to cover at least a part of the primary LED chip;
   wherein the secondary LED chip is separated apart from the phosphor by the cavity,
   wherein the multi-LED package is configured to emit a white light using the phosphor and the primary LED chip, a non-white light using the secondary LED chip, or both the white light and the non-white light,
   wherein the secondary slug is separated from the primary slug,
   wherein a bottom surface of the cavity is below the upper surface of the primary slug, wherein the primary LED chip is arranged on the bottom surface of the cavity, the bottom surface of the cavity being coplanar with an upper surface of the secondary slug,
   wherein the bottom surface of the cavity is separated from the upper surface of the secondary slug by a raised portion of the upper surface of the primary slug, and
   wherein the raised portion comprises a coplanar upper surface that completely surrounds the primary LED chip and separates the primary LED chip from the secondary LED chip.

5. The multi-LED package of claim 4, wherein the heat sink further comprises a single primary slug and a plurality of secondary slugs, the single primary slug and the secondary slugs being arranged around a center point of the opening, and the primary LED chip and a plurality of secondary LED chips are arranged on the single primary slug and the secondary slugs, respectively, along a circumference around the center point of the opening.

6. The multi-LED package of claim 5, wherein the lead frame structure comprises a plurality of lead frames, and the number of lead frames comprises two or more times the sum of the number of the primary and secondary slugs.

7. The multi-LED package of claim 1, wherein the primary LED chip and the secondary LED chip are each either a vertical-type LED chip directly connected to the heat sink or a lateral-type LED chip electrically connected to the lead frame structure by two bonding wires and being electrically insulated from the heat sink.

8. A multi-light emitting diode (LED) package, comprising:
   a heat sink comprising an upper surface and a first partition protruding from the upper surface;
   a primary LED chip arranged on a bottom surface of the heat sink inside the first partition;
   a secondary LED chip arranged on the upper surface outside the first partition;
   a lead frame structure electrically connected to the primary LED chip and the secondary LED chip to individually operate the primary LED chip and the secondary LED chip; and
   a phosphor disposed on the heat sink to cover at least a part of the primary LED chip,
   wherein the bottom surface inside the first partition is coplanar with the upper surface outside the first partition,
   wherein the bottom surface inside the first partition is separated from the upper surface outside the first partition by a raised portion of the first partition, and wherein the raised portion comprises a coplanar upper surface that completely surrounds the primary LED chip and separates the primary LED chip from the secondary LED chip.

9. The multi-LED package of claim 8, further comprising:
a housing to support the lead frame structure and the heat sink, and having an opening arranged at an upper portion of the housing, through which light generated from the primary LED chip and the secondary LED chip is emitted.

10. The multi-LED package of claim 8, wherein the multi-LED package is configured to emit a white light using the primary LED chip and the phosphor.

11. The multi-LED package of claim 10, wherein the secondary LED chip is a red LED chip, a green LED chip, a blue LED chip, an infrared LED chip, or an ultraviolet LED chip.

12. The multi-LED package of claim 9, wherein the primary LED chip and the secondary LED chip are disposed along a circumference around a center of the opening.

13. The multi-LED package of claim 8, wherein the first partition is integrally formed with the heat sink.

14. The multi-LED package of claim 8, wherein the heat sink further comprises a second partition protruding from the upper surface to surround the secondary LED chip.

15. A multi-light emitting diode (LED) package, comprising:
a heat sink comprising an upper surface and a cavity on the upper surface;
a primary LED chip arranged on a bottom surface of the cavity;
a secondary LED chip arranged on the heat sink upper surface outside the cavity, the secondary LED chip being one of a red LED chip, a green LED chip, a blue LED chip, an infrared LED chip, and an ultraviolet LED chip;
a lead frame structure electrically connected to the primary LED chip and the secondary LED chip, the lead frame structure to individually operate the primary LED chip and the secondary LED chip; and
a phosphor mixed with a transparent resin, the phosphor and the transparent resin being arranged in the cavity to cover at least a part of the primary LED chip;
wherein the secondary LED chip is separated apart from the phosphor by the cavity,
wherein the multi-LED package is configured to emit a white light using the phosphor and the primary LED chip, a non-white light using the secondary LED chip, or both the white light and the non-white light,
wherein the cavity is defined by a raised portion of the heat sink,
wherein the primary LED chip is arranged on the bottom surface of the cavity, the bottom surface of the cavity being coplanar with an upper surface of the heat sink,
wherein the bottom surface of the cavity is separated from the upper surface of the heat sink by a raised partition protruding from the heat sink, and
wherein the raised partition comprises a coplanar upper surface that completely surrounds the primary LED chip and separates the primary LED chip from the secondary LED chip.

* * * * *